US010859638B2

(12) United States Patent
Hammerschmidt et al.

(10) Patent No.: US 10,859,638 B2
(45) Date of Patent: Dec. 8, 2020

(54) PASSIVE BRIDGE CIRCUIT WITH OXIDE WINDOWS AS LEAKAGE SINK

(71) Applicant: Infineon Technologies AG, Neubiberg (DE)

(72) Inventors: Dirk Hammerschmidt, Finkenstein (AT); Manfred Steiner, Rennweg am Katschberg (AT)

(73) Assignee: Infineon Technologies AG

( * ) Notice: Subject to any disclaimer, the term of this patent is extended or adjusted under 35 U.S.C. 154(b) by 92 days.

(21) Appl. No.: 16/170,893

(22) Filed: Oct. 25, 2018

(65) Prior Publication Data

US 2019/0064246 A1  Feb. 28, 2019

Related U.S. Application Data

(63) Continuation of application No. 15/393,779, filed on Dec. 29, 2016, now Pat. No. 10,126,347.

(51) Int. Cl.
*G01R 31/50* (2020.01)
*G01R 31/52* (2020.01)

(52) U.S. Cl.
CPC .................. *G01R 31/50* (2020.01)

(58) Field of Classification Search
CPC .... G01R 31/025; G01R 15/20; G01R 31/007; B60L 3/0069; B60L 11/1803; B60L 3/0023; B60L 3/04; B60L 7/003
See application file for complete search history.

(56) References Cited

U.S. PATENT DOCUMENTS

| 5,473,253 | A | 12/1995 | Araki | |
|---|---|---|---|---|
| 5,481,194 | A * | 1/1996 | Schantz | G01R 31/006 324/522 |
| 5,581,104 | A * | 12/1996 | Lowrey | H01L 27/0251 257/355 |
| 6,433,554 | B1 * | 8/2002 | Kawate | G01D 3/022 324/500 |
| 2007/0151755 | A1 * | 7/2007 | Bilenko | H01L 23/62 174/260 |
| 2008/0297181 | A1 | 12/2008 | Ausserlechner | |
| 2013/0075859 | A1 * | 3/2013 | Kerber | H01L 28/10 257/531 |
| 2016/0047852 | A1 * | 2/2016 | Poisson | G01R 31/50 324/522 |
| 2016/0161289 | A1 | 6/2016 | Fujita | |

* cited by examiner

*Primary Examiner* — Akm Zakaria
(74) *Attorney, Agent, or Firm* — Design IP

(57) ABSTRACT

Leakage current detection systems and detection methods are provided. A leakage current detection system includes a passive bridge circuit disposed on a circuit substrate, the passive bridge circuit including a first branch having a first output and a second branch having a second output; a leakage surge structure disposed on the circuit substrate, where the leakage surge structure is electrically connected to a common node at which the first branch and the second branch are connected and is configured to draw a leakage current thereto from the passive bridge circuit; and a processing device configured to monitor for the leakage current, including summing a first output value at the first output with a second output value at the second output to determine a summed value, performing a common mode test using the summed value, and outputting a monitored result based on the common mode test.

23 Claims, 6 Drawing Sheets

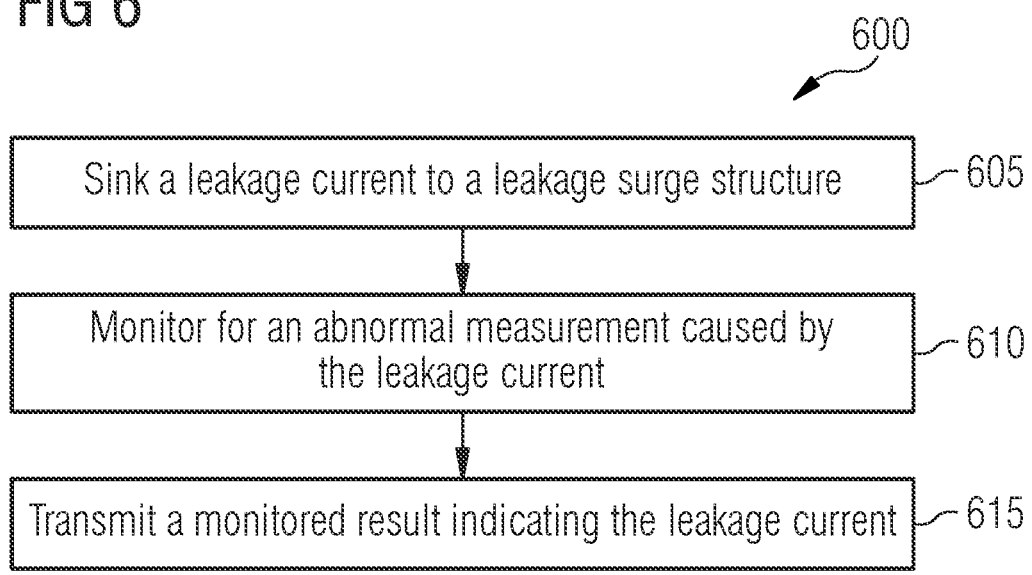

PASSIVE BRIDGE CIRCUIT WITH OXIDE WINDOWS AS LEAKAGE SINK

CROSS REFERENCE TO RELATED APPLICATION(S)

This application is a continuation of U.S. patent application Ser. No. 15/393,779 filed on Dec. 29, 2016, which is incorporated by reference as if fully set forth.

FIELD

The present disclosure relates generally to a passive bridge circuit configured to detect a leakage current and to methods for detecting a leakage current.

BACKGROUND

Die Bonding is the process of attaching the semiconductor die either to its package, the metallic lead frame or to some substrate. The process starts with selecting the target die from wafer or waffle tray, aligning the selected die to a target pad on the carrier or substrate, and then permanently attaching the selected die to the target pad using one of several die bonding techniques.

Epoxy bonding is one form of die bonding technique. Here, an epoxy bond is formed by attaching the die to the substrate (e.g., leadframe die pad) with the use of epoxy glue. A drop of epoxy is dispensed on the die pad and the die placed on top of it. This process uses adhesives such as polyimide, epoxy and silver-filled glass as die attach material to mount the die on the die pad of a package. Epoxy adhesives are typically electrical insulators and have poor thermal conductivity. To improve the electrical conductivity, epoxy or polyimides are filled with metal material (e.g., gold or silver). Thus, adhesive die attach materials may be regarded as suspensions of metal particles in a carrier (i.e., conductive die bond glue). The conductive die bond glue provides adhesion and cohesion to make a bond with the correct mechanical strength, while the metal particles provide electrical and thermal conductivity. It is noticeable that conductive resins are now often used where no electrical connection is required, just to get the benefit of enhanced thermal performance.

Package delamination forms a separation layer in between mold compound to chip, die paddle and leads, which may subsequently affect ground bond quality and may degrade package electrical performance, if it goes along with other influences such as high humidity, extreme temperatures or pollution of the environment (e.g., with salt). Delamination, or the separation between two supposedly connected layer interfaces within a chip package, is generally considered more as a failure attribute rather than as a failure mechanism, i.e., its presence in a package does not necessarily mean a failure. Its presence, however, has to be considered a valid package failure if its size, location, shape, or any other characteristic poses a reliability risk in the field, i.e., it can cause the device to fail by a secondary failure mechanism.

Secondary failure mechanisms that arise from the presence of delamination include die corrosion, package cracking, bond lifting, and breaking of the neck or heel of a bond. Device-related failures such as parametric shifts due to internal contamination can also be induced by package delamination.

Delamination is often addressed in the context of which layer interfaces are involved. As such, die-to-mold delamination is often treated differently from leadframe-to-mold delamination, since they result in different failure mechanisms and require different corrective actions for elimination.

For instance, a die-to-mold delamination can cause the molding compound to move laterally with respect to the die surface, which can either cause ball bond lifting or neck breaks. If a moisture path between the die-to-mold delamination and an external feature of the package exists, then moisture and contaminants can reach the die surface from outside, resulting in die corrosion or metal-to-metal leakage.

Additionally, if moisture enters the package, the moisture may resolve metal ions from the conductive die bond glue, resulting in charge carriers in the water that collects inside the package. The metal ions may reach the bond pads of a chip due to an attraction of the ions by an electric field generated by the bond pads and may cause a leakage current to flow between output pads at different electrical potentials.

In cases of a structure with a driven interface these leakages do usually not cause an effect on the measurement, since they only represent an additional load current for the driver. However, in the case of passive elements (i.e., components without drivers), like resistive sensor bridges with a relatively high impedance, currents between the output pads can change the measurement value by an amount $R_{bridge} * I_{leakage}$ without any chance of a detection, where $R_{bridge}$ is the resistance value of the resistive sensor bridge and $I_{leakage}$ is the leakage current.

Therefore, an improved device capable of detecting a presence of a leakage current (i.e., a detectable fault) and/or measuring the leakage current may be desirable.

SUMMARY

One or more embodiments relate to a leakage current detection system and a method of detecting a leakage current in a passive bridge circuit.

A leakage current detection system includes a passive bridge circuit comprising a first branch having a first output and a second branch having a second output; a first output pad electrically connected to the first output; a second output pad electrically connected to the second output; a leakage surge structure disposed between the first output pad and the second output pad, where the leakage surge structure is connected to a low-ohmic node and is configured to draw a leakage current from the passive bridge circuit and pull voltages at the first and the second output pads in a same direction on a condition that the leakage current flows through at least one element of the passive bridge circuit; and a processing device configured to monitor for the leakage current and output a monitored result.

A method of detecting a leakage current in a passive bridge circuit is provided. The passive bridge circuit includes a first branch having a first output electrically connected to a first output pad and a second branch having a second output electrically connected to a second output pad. The method includes sinking a leakage current to a leakage surge structure disposed between the first output pad and the second output pad, where the leakage surge structure is connected to a low-ohmic node and is configured draw the leakage current from the passive bridge circuit; pulling voltages at the first and the second output pads in a same direction on a condition that the leakage current flows through at least one element of the passive bridge circuit to the leakage surge structure; monitoring for an abnormal measurement caused by the leakage current; and outputting a monitored result indicating the leakage current based on detecting the abnormal measurement.

BRIEF DESCRIPTION OF THE DRAWINGS

Embodiments are described herein making reference to the appended drawings.

FIG. 6 illustrates a flow diagram of a method of detecting a leakage current according to one or more embodiments.

DETAILED DESCRIPTION

Figure 1:
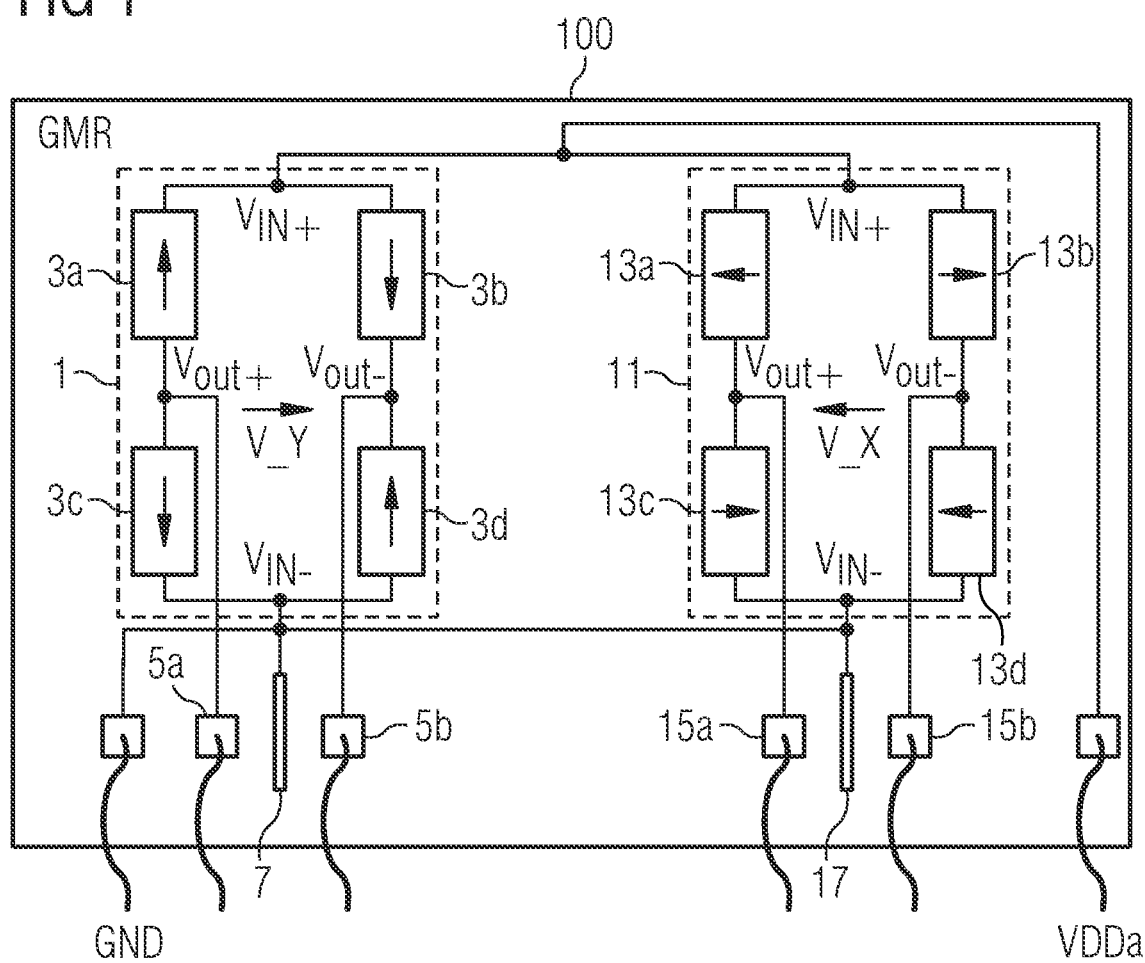
FIG. 1 illustrates a schematic diagram of passive bridge circuits implemented according to one or more embodiments.

In the following, various embodiments will be described in detail referring to the attached drawings. These embodiments are given for illustrative purposes only and are not to be construed as limiting. For example, while embodiments may be described as comprising a plurality of features or elements, in other embodiments, some of these features or elements may be omitted, and/or may be replaced by alternative features or elements. In other embodiments, further features or elements in addition to those explicitly shown or described may be provided. In addition, features of the different embodiments described hereinafter may be combined with each other, unless specifically noted otherwise.

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

A bridge circuit is a topology of electrical circuit in which two circuit branches (usually in parallel with each other) are "bridged" by a third branch connected between the first two branches at some intermediate point along them. A bridge circuit may include resistive, capacitive, and inductive elements, or a combination thereof. As used herein, "bridge circuit," "bridge device," and "bridge" may be used interchangeably.

An active device, such as a driver circuit, is any type of circuit component with the ability to electrically control electron flow (electricity controlling electricity). Components incapable of controlling current by means of another electrical signal are called passive devices. Passive component cannot introduce net energy into a circuit. Thus, passive bridge circuits comprise passive components (e.g., resistors (R), capacitors (C), and/or inductors (L)) but do not include active components, such as output drivers. Memristors, transformers, transducers, sensors, detectors, RC networks, LC networks, piezoelectric devices, and antennas are also considered passive devices and may be applicable to one or more embodiments disclosed herein.

As one example, a passive bridge may be implemented in a magnetic sensor. However, a passive bridge is not limited thereto and may be implemented in any device or any application that uses a passive bridge.

A magnetic field sensor, for example, includes one or more magnetic field sensor elements (e.g., passive resistive elements) that measure one or more characteristics of a magnetic field (e.g., an amount of magnetic field flux density, a field strength, a field angle, a field direction, a field orientation, etc.) corresponding to detecting and/or measuring the magnetic field pattern of an element that generates the magnetic field (e.g., a magnet, a current-carrying conductor (e.g., a wire), the Earth, a permanent magnet or other magnetic field source). A resistive value of the one or more magnetic field sensor elements may change when exposed to a magnetic field. The resistive value, which corresponds to a characteristic of the magnetic field, may be measured such that information regarding the characteristic of the magnetic field is obtained. Further, the resistive value may be measured in the form of a voltage or current measurement.

Magnetic field sensor elements include, but are not limited to, sensor elements utilized in magneto-resistive sensors, often referred to as XMR sensors which is a collective term for anisotropic magneto-resistive (AMR), giant magneto-resistive (GMR), tunneling magneto-resistive (TMR), etc. For example, magnetic field sensor elements in an XMR sensor may be arranged in a bridge formation to provide a resistance value (e.g., in the form of a voltage output) corresponding to a measured characteristic of a magnetic field.

According to one or more embodiments, one or more non-bonded or bonded leakage surge structures with oxide openings are provided between and/or surrounding two or more output pads of a passive bridge circuit. The leakage surge structures may provide a defined current path for leakage currents such that a presence of a leakage current can be detected, measured and/or indicated to a user or other device. As used herein, the leakage surge structures may be referred to as leakage surge pads such that the terms may be used interchangeably.

The leakage surge structures may be connected to a low-ohmic node, such as signal ground (GND) or a power supply voltage (VDD), but any other potential that pulls into a detectable direction in case of leakage may be used as well. The connection to a low-ohmic node with a potential that is significantly different from the potential of the bridge outputs, for example, ensures that both output pads are pulled into the same direction when a leakage (i.e., leakage current) occurs such that the presence of the leakage can be detected by a common mode test or by comparison of the half bridge signals.

The phrase "common mode" refers to when a signal appears that is common to both inputs, essentially when they are tied together. A common mode potential is a half-sum of two voltages (V1+V2)/2 (i.e., an average of the absolute value of two voltages). In the case of a common mode of a bridge circuit, the common mode is an average of an output voltage of a first side (first branch) of the bridge (VOut+) and an output voltage of a second side (second branch) of the bridge (VOut−) and should, ideally, be equal to half of the supply voltage (i.e., the mid-point between VDD and GND) in the case of a symmetric bridge circuit. In the case of an asymmetric bridge circuit, the common mode is equal to a predefined fraction of the supply voltage of the passive bridge circuit. However, with the implementation of a leakage surge structure according to the disclosed embodiments, a leakage current may cause the common mode voltage to deviate from a common mode value that is equal to half of the supply voltage, or deviate from some other predefined fraction of the supply voltage. Thus, if the measured common mode voltage deviates from a this common mode value (i.e., not equal to the predefined fraction of the supply voltage), a presence of a leakage current can be detected and/or measured.

Thus, a common mode diagnosis can be done by monitoring of the common mode of the two output pads of a bridge which provide output signals VOut+ and VOut−, respectively. Both output signals VOut+ and VOut− may be measured single ended against GND (or any other potential that pulls into a detectable direction) and can be compared. The two measured output signals VOut+ and VOut− should deliver signals changing by the same amount in different directions (i.e., a change in a positive direction by one measurement signal and a change in a negative direction of equal magnitude by another measurement signal). For example, if VOut+ becomes more positive, then VOut− becomes more negative by a same amount in magnitude. Conversely, if VOut+ becomes less positive, then VOut− becomes less negative by a same amount in magnitude. Thus, the common mode voltage should be equal (within a tolerance window of about 5%) to a common mode value that is equal to a predefined fraction of the supply voltage (e.g., half of the supply voltage). However, as noted above, through implementation of one or more leakage surge structures, if a leakage current is present between the two output pads, the common mode voltage (|VOut+|+|VOut−|)/2 of the bridge will deviate from the common mode value, and the error can be detected.

Without the leakage surge structure disposed between the two output pads and connected to, for example, ground GND, the leakage current may cause the output voltage of each output pad to decrease in magnitude. However, the common mode voltage remains equal to the common mode value of the predefined fraction of the supply voltage since each output voltage is decreased in magnitude (in opposite directions) by the same amount (i.e., the absolute value of the decrease of each output voltage is equal). Thus, without the leakage surge structure, the bridge may seem to be operating normally with no indication of a leakage current being present. However, the output values may provide incorrect information due to the leakage current and lead to errors during use of a device.

FIG. 1 illustrates a schematic diagram of bridge circuits implemented in a GMR sensor 100 according to one or more embodiments. In particular, the GMR sensor 100 includes a first bridge circuit 1 (i.e., Y bridge) and a second bridge circuit 11 (i.e., X bridge) disposed on a substrate (e.g., a semiconductor die or layer within an integrated circuit or chip) (not shown). Each of the first bridge circuit 1 and the second bridge circuit 11 may be part of an integrated circuit of the semiconductor chip (referred herein as a "chip"). Each of the first bridge circuit 1 and the second bridge circuit 11 include four resistive elements that are configured to measure a characteristic of a magnetic field according to a reference direction that corresponds to a direction of an arrow depicted therein. Further, bond pads, disposed on the substrate and made of one or more metal layers, are provided for input and output terminals of the circuit and are electrically connected to the resistive elements by wire, conductive tracks, or the like.

In particular, the first bridge circuit 1 includes upper resistive elements 3a and 3b connected to VIn+ (e.g., analogue supply voltage VDDa) and lower resistive elements 3c and 3d connected to VIn− (e.g., GND). In addition, the outputs of the resistive elements 3a and 3c are connected to a first output pad 5a (VOut+) of a first branch and the outputs of the resistive elements 3b and 3d are connected to a second output pad 5b (VOut−) of a second branch. VOut+ and VOut− are analog outputs of the first bridge circuit 1 that provide measurement signals generated by the first bridge circuit 1.

In addition, the first bridge circuit 1 includes a leakage surge structure 7 (e.g., an electrode structure) disposed between the first output pad 5a (VOut+) and the second output pad 5b (VOut−), and connected to the bond pad GND via an electrical connection. As noted previously the leakage surge structure 7 may be connected to bond pad VDDa depending on implementation. The leakage surge structure 7 is a conductive structure (e.g., made of similar material as the bond pads) configured to be a leakage sink and may have a shape with one longer axis that extends between the output pads 5a and 5b, and may extend past one or more sides of the output pads 5a and 5b. That is, the leakage surge structure 7 may be longer in one direction than the output pads 5a and 5b such that one or both ends of the leakage surge structure 7 extends beyond the ends of the output pads 5a and 5b.

Bond pads (e.g., bond pads GND and VDDa) are typically resistant to mechanical bond forces and, therefore, often require to use a stack of metal layers, oxide layers and via layers. Due to this requirement, active structures (e.g., electrostatic discharge (ESD) protection structures or any other active circuitry component) are typically not tolerated below the bond pads in some technologies. However, the leakage surge structure 7 may have a different vertical structure than the typical bond pads. For example, the leakage surge structure 7 may be formed in an upper metal layer such that one or more active structures (e.g., ESD protection structures) may be placed below the leakage surge structure 7 in a lower layer of the chip (integrated circuit).

The leakage surge structure 7 may further have an oxide window (i.e., opening or cavity) such that a surface (e.g., upper surface from a plan view of the chip package) of the leakage surge structure 7 is exposed to or has an open contact to an upper surface of the chip, where the upper surface of the chip is ultimately covered by a package molding. The oxide window is an area where a passivation layer is etched away down to the top level metal layer (i.e., down to the surface of the leakage surge structure 7). A similar process step may be used for the pad openings. Consequently, the walls of the oxide window are a cross section through a passivation stack, which may typically contain oxide, nitride and polyimide but other dielectric materials like Teflon or Parylene may also be found.

The surface of the leakage surge structure 7 exposed to the oxide window is a conductive surface, such a metallic surface. The oxide window may be configured such that a galvanic contact at the conductive surface of the leakage surge structure 7 provides entry for mobile charge carriers to a path dedicated for the leakage current. For example, the oxide window may be configured to collect conductive ions, that cause a leakage current and that flow into the oxide window so that they contact with the surface of the leakage surge structure 7. Thus, the conductive ions collected in the oxide window provide a conductive path (e.g., from the outputs Vout+ and Vout− of the bridge circuit 1 or from output pads 5a/5b) for the leakage current to flow to the leakage surge structure 7.

The leakage surge structure 7 may be formed in a top metal layer of the chip such that the exposed surface (and oxide window) of the leakage surge structure 7 is planar or substantially planar with the surface of the chip. Here, there oxide window may have no or minimal thickness or depth. Alternatively, the leakage surge structure 7 may be formed in a metal layer below the top metal layer such that the oxide window extends from the exposed surface of the leakage surge structure 7 to the surface of the chip. Here, the oxide window may have a thickness or depth of at least one metal layer.

Without the leakage surge structure 7, the leakage current from Vin+ would flow from the left side of the first bridge circuit 1 to the right side of the first bridge circuit 1. Instead, with the leakage surge structure 7, the leakage current will flow from the left side of the first bridge circuit 1 to ground GND and from the right side of the first bridge circuit 1 to ground GND. The leakage surge structure 7 collects a leakage current that flows in the case that charger carriers from, for example, mobile ions resolved from a conductive die bond glue (or any other reason), exist around and/or between the output pads 5a and 5b.

Thus, due to the leakage surge structure 7 disposed between the output pads 5a and 5b, a leakage current from both output pads 5a and 5b flow to ground GND. The leakage surge structure 7 causes a leakage current from Vin+ (i.e., from supply VDDa) to flow through the upper two branch elements 3a and 3b of the bridge 1 to the output pads 5a and 5b, respectively, but not through the two lower branch elements 3c and 3d of the bridge 1. Due to the leakage surge structure 7, the voltage at the output pads 5a and 5b no longer change symmetrically in opposite directions. For example, if a leakage current is present, it will be forced to flow to the leakage surge structure 7 and the voltages of output pads 5a and 5b may change by different amounts and/or may change in the same direction (e.g., both in the positive or negative direction). Thus, leakage surge structure 7 is disposed between output pads 5a and 5b such that a leakage current between the output pads 5a and 5b flows to the leakage surge structure 7. As used herein, "between" may refer to a proximal area that includes a space between the output pads 5a and 5b but may not necessarily require the leakage surge structure 7 to be in a same lateral plane between the output pads 5a and 5b (see e.g., FIG. 2B and FIG. 5).

In one or more embodiments, the leakage surge structure 7, connected to GND or VDDa, ensures that both output pads 5a and 5b are pulled into the same direction (instead of opposite directions under normal operation) and the leakage can be detected by the above described common mode test or by comparison of the half bridge signals.

Due to this disparity in leakage current flow between the upper and the lower branch elements, an average of VOut+ and VOut− (i.e., (|VOut+|+|VOut−|)/2) will be pulled down away from the common mode value that is equal to a predefined fraction of the supply voltage (i.e., the common mode voltage of the first bridge circuit 1 will be less than the common mode value) in the case that the leakage surge structure is connected to GND. In the alternative, if the leakage surge structure is connected to VDDa, the average of VOut+ and VOut− will be pulled up away from the common mode value that is equal to a predefined fraction of the supply voltage. In either case, the average of VOut+ and VOut− is no longer equal to the common mode value when a leakage current is present in the first bridge circuit 1. Since the common mode voltage of the bridge circuit 1 changes in reference to the common mode value, and, since the change can be detected, a leakage current can be detected.

An external controller, microcontroller, processor (e.g., an Electronic Control Unit (ECU)), or an application-specific integrated circuit (ASIC), may monitor the voltages at the output pads 5a and 5b, and perform a common mode test to detect the presence of a leakage current. For example, a controller may calculate the common mode voltage of the first bridge circuit and compare the calculated common mode voltage to an expected common mode voltage. If the calculated common mode voltage differs from the expected common mode voltage or differs from the expected common mode voltage by a predetermined threshold amount (e.g., 5% of the expected common mode voltage to account for a tolerance window), the controller may determine that an error is present, which may be caused by a leakage current as a result of, for example, delamination.

Similarly, a leakage current can be monitored in the second bridge circuit 11, which is similarly configured as described with respect to the first bridge circuit 1. For example, the first second circuit 1 includes upper resistive elements 13a and 13b connected to VIn+ (e.g., analogue supply voltage VDDa) and lower resistive elements 13c and 13d connected to VIn− (e.g., GND). In addition, the outputs of the resistive elements 13a and 13c are connected to a first output pad 15a (VOut+) of a first branch and the outputs of the resistive elements 13b and 13d are connected to a second output pad 15b (VOut−) of a second branch. VOut+ and VOut− are analog outputs of the first bridge circuit 1 that provide measurement signals generated by the first bridge circuit 1.

In addition, the second bridge circuit 11 includes a leakage surge structure 17 (e.g., an electrode structure) disposed between the first output pad 15a (VOut+) and the second output pad 15b (VOut−), and connected to the bond pad GND via an electrical connection. As noted previously the leakage surge structure 17 may be connected to bond pad VDDa depending on implementation. The leakage surge structure 17 is a conductive structure (e.g., made of similar material as the bond pads) and may have a shape with one longer axis that extends between the output pads 15a and 15b, and may extend past one or more sides of the output pads 15a and 15b. That is, the leakage surge structure 17 may be longer in one direction than the output pads 15a and 15b such that one or both ends of the leakage surge structure 17 extends beyond the ends of the output pads 15a and 15b. The leakage surge structure 17 also may include an oxide window exposes the surface of the leakage surge structure 17 to an upper surface of the chip.

A controller, microcontroller, processor (e.g., an ECU), or an ASIC, external to the chip, may monitor the voltages at the output pads 15a and 15b, and perform a common mode test to detect the presence of a leakage current. For example, a controller may calculate the common mode voltage of the first bridge circuit and compare the calculated common mode voltage to an expected common mode voltage. If the calculated common mode voltage differs from the expected common mode voltage or differs from the expected common mode voltage by a predetermined threshold amount (e.g., 5% of the expected common mode voltage to account for a tolerance window), the controller may determine that an error is present, which may be caused by a leakage current caused by, for example, delamination. The controller may further transmit a signal that indicates the fault in the device to a component or a display such that a user is notified of the fault.

FIGS. 2A-2E illustrate schematic diagrams of lower portions of passive bridge circuits with different arrangements of one or more leakage surge structures according to one or more embodiments. In particular, FIGS. 2A to 2E show an area in which bond pads and output pads are provided. The leakage surge structures may take on many different shapes and patterns so long as a portion is disposed between the output pads of the passive bridge circuit. These leakage surge structures may again be connected to one of GND or VDD and may be configured with an oxide window, as described above. Shapes may include a shape that forms a corner, a bracket or a ring around the output pads that are to be protected, and it will be appreciated that other shapes and arrangements are contemplated within the scope of this disclosure.

Figure 2A:
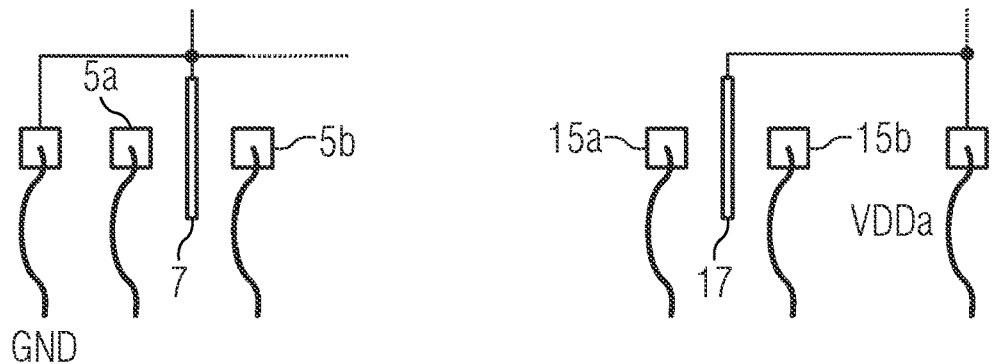
FIGS. 2A-2E illustrate schematic diagrams of portions of passive bridge circuits with different arrangements of one or more leakage surge structures according to one or more embodiments.

FIG. 2A shows a leakage surge structure 7 electrically connected to a ground bond pad GND and a leakage surge structure 17 electrically connected to a supply bond pad VDDa. As described above, when a leakage current exists from the supply voltage VDDA, the common mode voltage of the first bridge circuit (left) will be pulled down away from the common mode value that is equal to a predefined fraction of the supply voltage, and the common mode voltage of the second bridge circuit (right) will be pulled up away from the common mode value that is equal to a predefined fraction of the supply voltage. An external device, such as a controller, microcontroller, processor, or an ASIC, collectively referred to as "processing devices", may then detect this deviation and indicate a fault in the device.

Figure 2B:
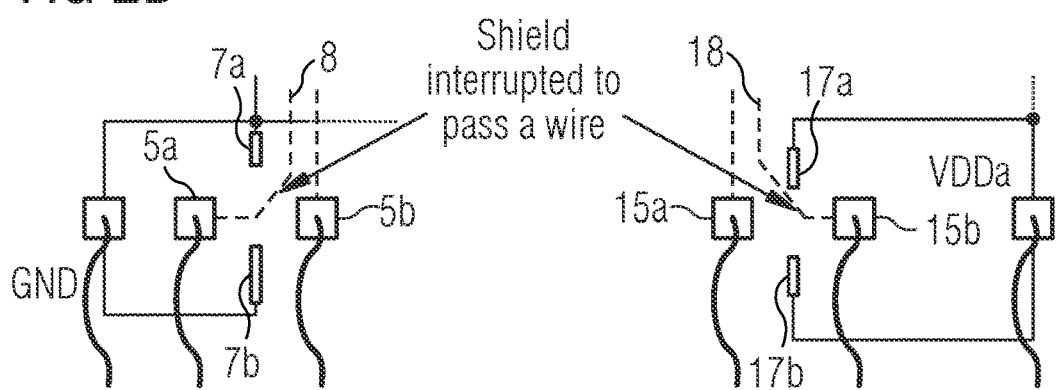

FIG. 2B shows another arrangement in which a leakage surge structures 7a and 7b are electrically connected to a ground bond pad GND and leakage surge structures 17a and 17b are electrically connected to a supply bond pad VDDa. While the leakage surge structures 7a and 7b and the leakage surge structures 17a and 17b are still disposed between their respective output pads (5a/5b and 15a/15b), the leakage surge structures of each bridge are interrupted such that a wire 8 or 18 (or conductive track) can pass from an output pad 5a or 15b to another part of the integrated circuit. This arrangement may be used due to layout restrictions in technologies having a low number of routing layers. Furthermore, the leakage surge structures may not always be shaped equally.

Figure 2C:
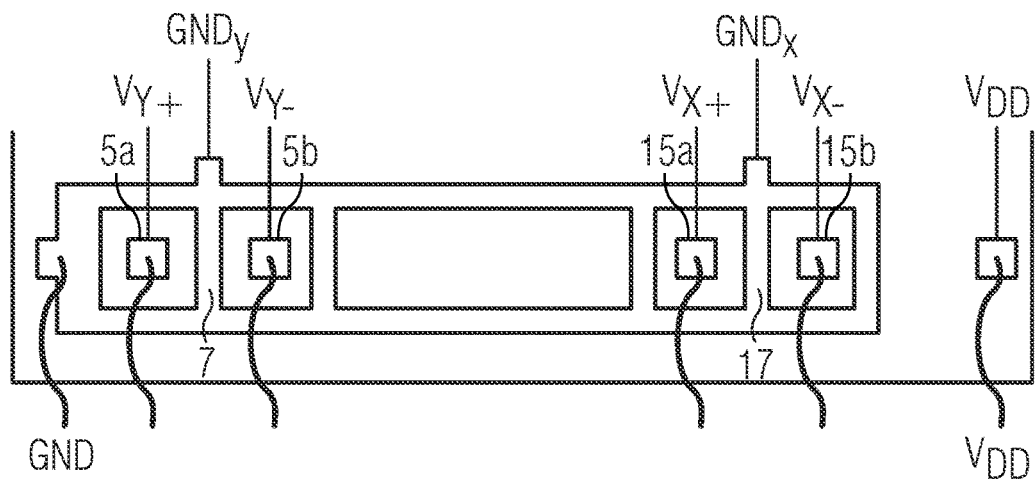

FIG. 2C shows another arrangement in which a leakage surge structures 7 and 17 are electrically connected to a ground bond pad GND as a single integral member. For example, the leakage surge structures 7 and 17 are formed as rings around both drift sensitive pads (i.e., output pads 5a/5b and output pads 15a/15b). Furthermore, the metal layer which forms the leakage surge structures 7 and 17 is directly connected to the ground bond pad GND.

Figure 2D:
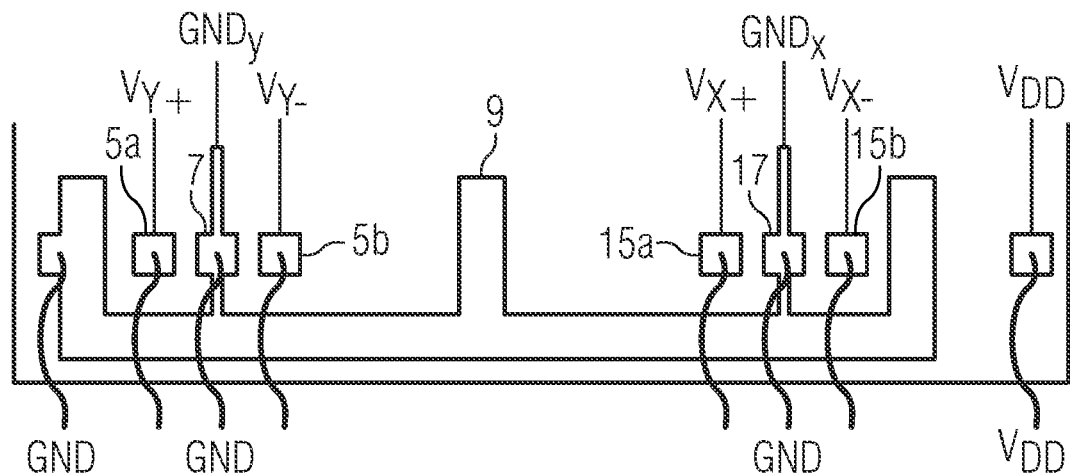

FIG. 2D shows another arrangement in which the leakage surge structures 7 and 17 are formed by an additional bond pads. These additional bond pads may be formed as GND bond pads by bonding the bond pad via a wire to GND. Alternatively, the leakage surge structures 7 and 17 may be formed as supply VDD bond pads. However, while additional GND bonds between the output pads may be desired, the arrangement may not be possible depending on the chip package which is often given by application requirements and usually offers a limited number of pins or the number of GND bonds to a common die pad GND. However, if possible, the additional leakage surge structures 7 and 17 formed as bond pads further reduces a possibility of leakage in the chip package since the additional bonds sink leakage currents similar to the open metal areas.

Furthermore, if one or more bond pads are used for the leakage surge structure 7 or 17, the leakage surge structure 7 or 17 may be connected to ground GND via an external resistor. The external resistor is electrically connected to the leakage surge structure and external to a surge potential, which is typically GND or VDD. In a case where a leakage current is present, the leakage current would sink through the external resistor and cause a voltage drop across the resistor. The voltage drop across the resistor may be measured and monitored in order to directly detect a leakage current based on the measured voltage drop (e.g., based on a threshold test or comparison test based on an expected value). For example, the voltage drop across the resistor may be monitored using an analogue-to-digital converter (ADC) of a microcontroller or other controller or processor (e.g., the ECU).

In addition, an additional leakage surge structure 9 shown in FIG. 2D (or additional leakage surge structures 9 and 19 shown in FIG. 2E) may be provided between neighboring bond pads of the first bridge circuit 1 and the second bridge circuit 11 (e.g., between output pad 5b and output pad 15a). This additional leakage surge structure 9 is also connected to ground and had an oxide window. The additional leakage surge structure 9 may provide isolation between the neighboring bond pads in the event a leakage current is present.

Figure 2E:
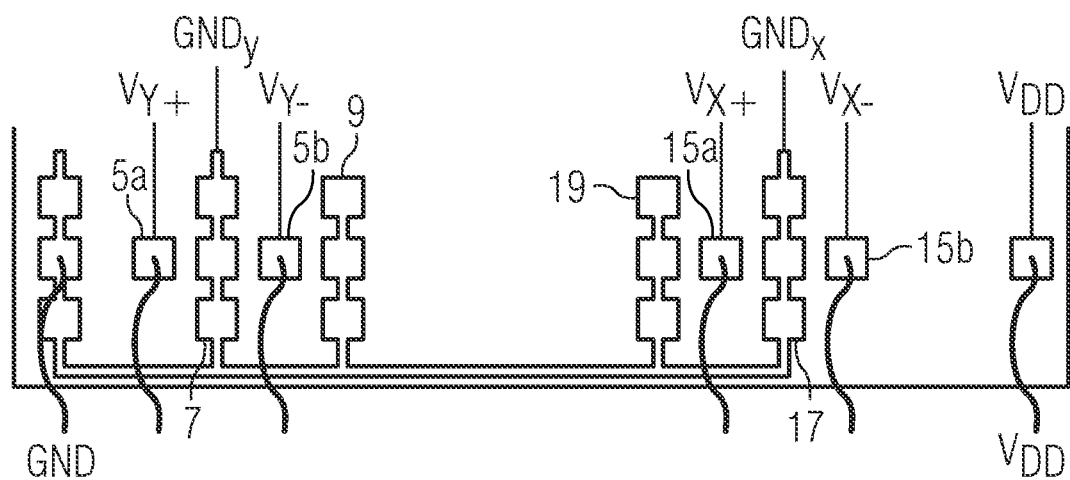

FIG. 2E shows another arrangement in which the leakage surge structures 7 and 17 are formed by chains of bond pads, which may not bonded or of which only few may be bonded. The chains of bond pads may be connected to ground GND by a conductive track or the like. In addition, additional leakage surge structures 9 and 19 may be provided to isolate the neighboring bond pads (e.g., output pads 5b and 15a) from each other.

Figure 3:
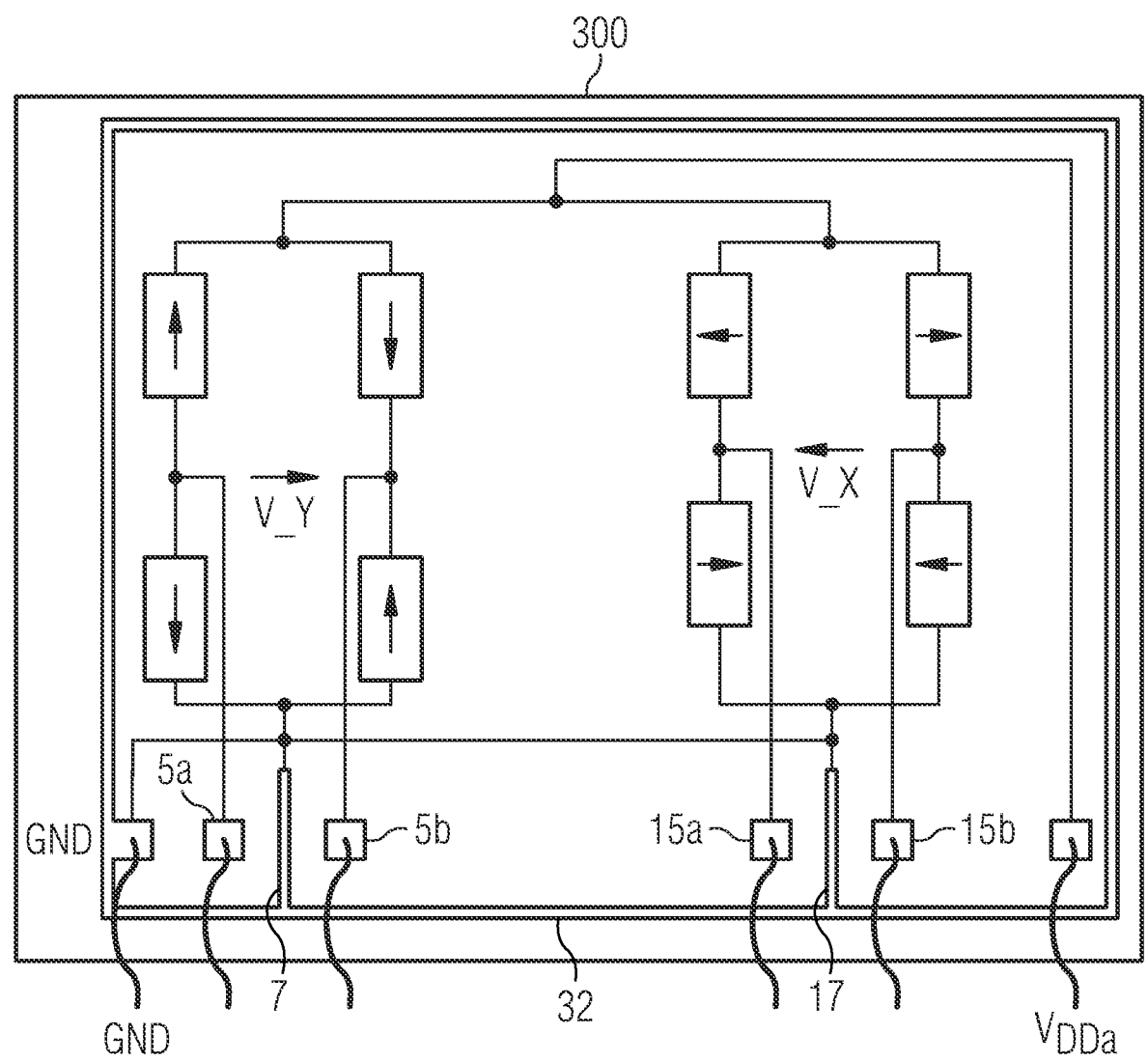
FIG. 3 illustrates a schematic diagram of bridge circuits implemented in a sensor device according to one or more embodiments.

FIG. 3 illustrates a schematic diagram of bridge circuits implemented in a GMR sensor 300 according to one or more embodiments. In particular, the GMR sensor 300 includes a compete GND ring 32, which may also be part of a standard pad ring, with an oxide window (opening) in a passivation (e.g., stack of oxide, nitride and polyimide) on a GND metal ring. The leakage surge structures 7 and 17 are connected to and/or integrated with the GND ring 32. The oxide window may be formed at the leakage surge structures 7 and 17. Furthermore, the oxide window may be formed around the entire GND ring 32 or at least portions thereof. The oxide windows provide an exposed surface of the leakage surge structures 7 and 17 and the exposed metal portions of the GND ring 32 with an open contact to an upper surface of the chip.

Figure 4:
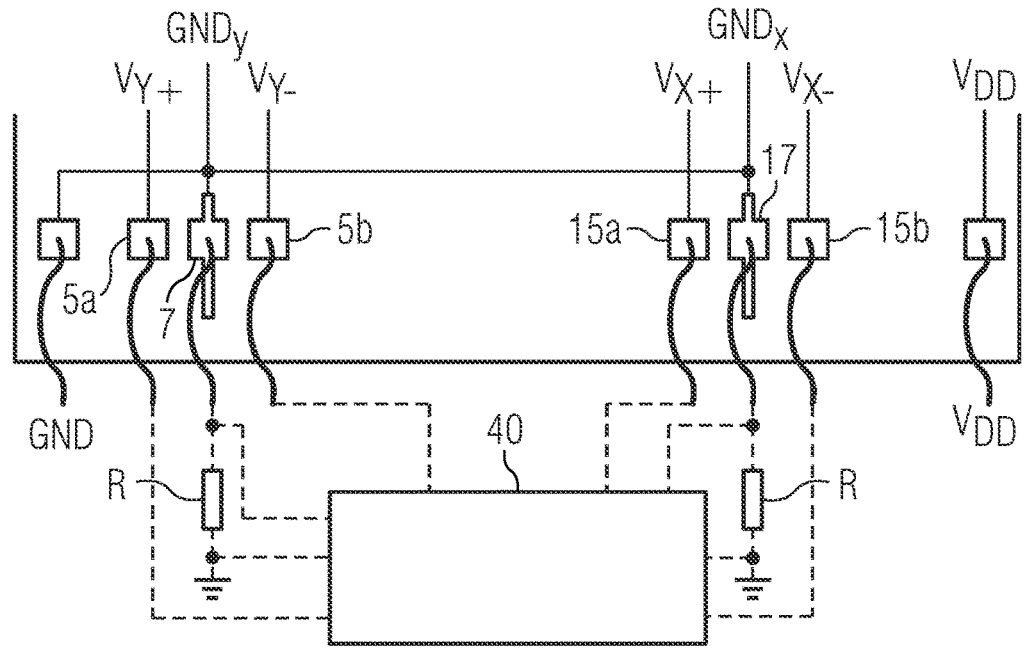
FIG. 4 illustrates a schematic diagram of a portion of a passive bridge circuit with one or more outputs connected to an external monitor unit according to one or more embodiments.

FIG. 4 illustrates a schematic diagram of a portion of a passive bridge circuit with one or more outputs connected to an external monitor unit 40 according to one or more embodiments. The external monitor unit 40 may be included on or separate from a same printed circuit board (PCB) as that on which the chip is provided. As noted above, an external device, such as external monitor unit 40, may be a controller, a microcontroller, a processor or an ASIC, collectively referred to as "processing devices", and may be configured to detect a fault caused by a leakage current.

For example, the external monitor unit 40 may receive output signals from output pads 5a/5b and/or 15a/15b, and perform a common mode test thereon to determine whether a leakage current is present in a bridge circuit, as described, for example, with respect to FIG. 2A.

Alternatively, the external monitor unit 40 may receive a signal from the one or both of the leakage surge structures 7 and 17, by use of a pull-down resister R, and measure a current from the leakage surge structure(s) 7 and 17 to determine whether a leakage current is present in a bridge circuit, as described, for example, in reference to FIG. 2D.

Figure 5:
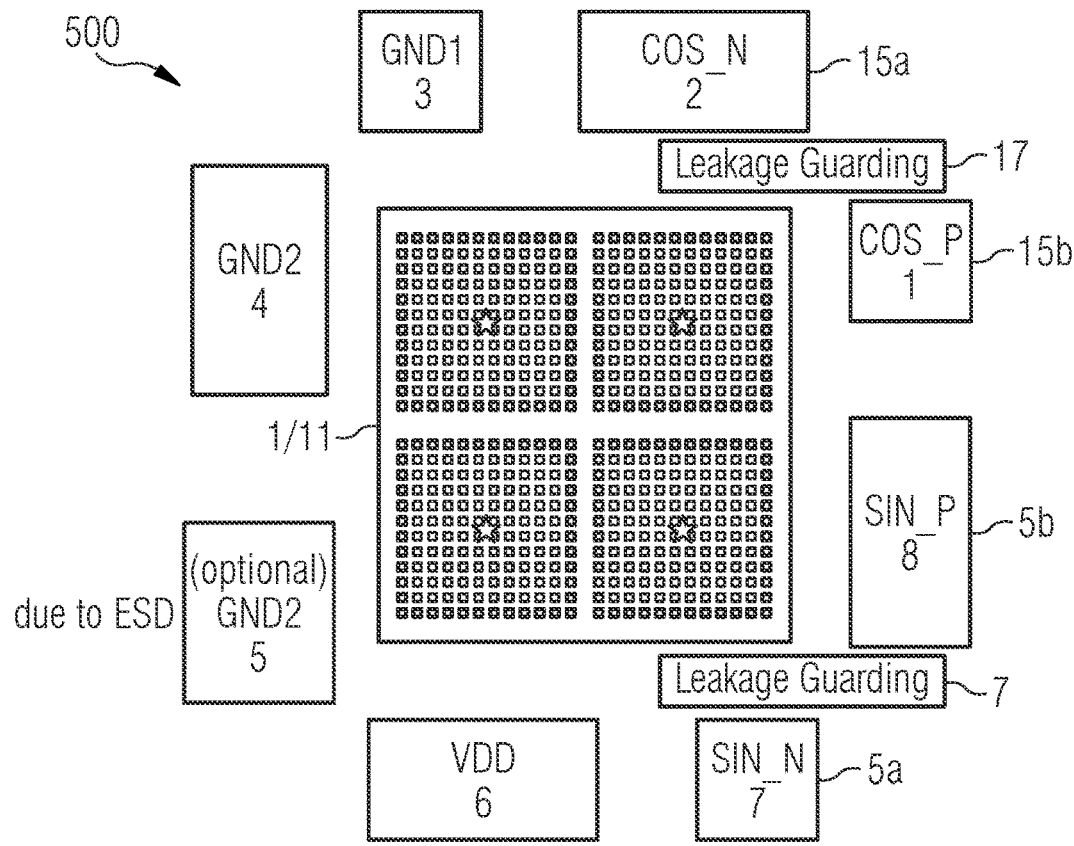
FIG. 5 illustrates a schematic layout of an integrated circuit including passive bridge circuits according to one or more embodiments.

FIG. 5 illustrates a schematic layout of an integrated circuit 500 including passive bridge circuits according to one or more embodiments. The integrated circuit 500 includes bridge circuits 1 and 11 each including four bridge resistors, where one may be layered over the other, various bond pads (e.g., GND and VDD) with corresponding pin numbers 1-8, output pads 5a, 5b, 15a and 15b, and leakage surge structures 7 and 17. FIG. 5 shown one possible arrangement in for providing the leakage surge structures 7 and 17 extending between their respective output pads 5a/5b and 15a/15b.

FIG. 6 illustrates a flow diagram of a method 600 of detecting a leakage current according to one or more embodiments. The method 600 includes sinking a leakage current to a leakage surge structure disposed between a first output pad and a second output pad of a passive bridge circuit (operation 605). As described above, the leakage surge structure may be connected to a low-ohmic node so that it draws the leakage current from the passive bridge circuit. The leakage surge structure may further include an opening formed over at least a portion of a conductive surface of the leakage surge structure such that the opening extends from the conductive surface of the leakage surge structure to a surface of the semiconductor chip. The method 600 further includes monitoring for an abnormal measurement caused by the leakage current (operation 610). The abnormal measurement may be detected by the above-described common mode test, the above-described voltage drop test (e.g., across a resistor), or the like. The method 600 further includes transmitting a monitored result that indicates a presence of the leakage current when detected based on an abnormal measurement (operation 615). The monitored result may also indicate that the device including the passive bridge circuit is behaving normally (e.g., no leakage current is present).

In addition, the method 600 may include collecting conductive ions in an opening that exposes a surface of the leakage surge structure to a surface of a semiconductor chip that incorporates the passive bridge circuit and the leakage surge structure, and forming a conductive path comprised of the conductive ions that draws at least a portion of the leakage current from a first branch of the passive bridge circuit and draws at least another portion of the leakage current from a second branch of the passive bridge circuit.

In addition, the method 600 may include calculating a common mode voltage of the first and the second output pads, comparing the calculated common mode voltage to common mode value that is equal to a predefined fraction (e.g., half) of a supply voltage of the passive bridge circuit, and, on a condition the common mode voltage differs from the common mode value by at least a predetermined threshold, transmitting the monitored result that indicates an error. Additionally or alternatively, the method 600 may include measuring a voltage drop across a resistive element electrically connected to the leakage surge structure and external to the passive bridge circuit, comparing the measured voltage drop to an expected voltage drop, and transmitting the monitored result based on a comparison test.

In view of one or more of the described embodiments, the leakage surge structures may ensure that leakage current that may appear in a chip package due to delamination is pulled into a direction that can be detected by monitoring a passive bridge structure, for example, by detecting common mode shifts, and alert a system and/or user to a fault within the chip package for further evaluation.

While an example of a magnetic sensor is used to demonstrate passive bridge circuits, the embodiments are not limited thereto, and may be utilized in other types of sensors (e.g., passive piezoresistive pressure sensors or accelerometers) or any other integrated circuit that includes one or more passive bridge structures or circuits. Thus, it will be appreciated that the concepts described herein are applicable to any type of passive bridge circuit, device or system.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, an application-specific integrated circuit (ASIC), a programmable computer or an electronic circuit. In some embodiments, some one or more of the method steps may be executed by such an apparatus.

Depending on certain implementation requirements, embodiments provided herein can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

The above described exemplary embodiments are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A leakage current detection system comprising:
a passive bridge circuit disposed on a circuit substrate, the passive bridge circuit comprising a first branch having a first output and a second branch having a second output;
a leakage surge structure disposed on the circuit substrate, wherein the leakage surge structure is electrically connected to a common node at which the first branch and the second branch are connected and is configured to draw a leakage current thereto from the passive bridge circuit; and a processing device configured to monitor for the leakage current, including summing a first output value at the first output with a second output value at the second output to determine a summed value, performing a common mode test using the summed value, and outputting a monitored result based on the common mode test.

2. The leakage current detection system of claim 1, wherein the processing device is configured to perform the common mode test by determining that half of the summed value is equal to a common mode potential of the passive bridge circuit when the leakage current is not present, or that half of the summed value is not equal to the common mode potential of the passive bridge circuit when the leakage current is present.

3. The leakage current detection system of claim 1, wherein the leakage surge structure is configured to draw the leakage current from the passive bridge circuit and pull voltages at the first and the second outputs in a same direction on a condition that the leakage current flows through at least one element of the passive bridge circuit.

4. The leakage current detection system of claim 1, wherein, in an absence of the leakage current, the passive bridge circuit is configured such that the voltages at the first and the second outputs change in opposite directions.

5. The leakage current detection system of claim 1, further comprising:
an opening configured to expose a conductive surface of the leakage surge structure to a surface of a semiconductor chip that incorporates the passive bridge circuit and the leakage surge structure.

6. The leakage current detection system of claim 5, wherein the opening is configured such that a galvanic contact at the conductive surface of the leakage surge structure provides entry for mobile charge carriers to a path dedicated for the leakage current such that voltages at the first and the second outputs are pulled in a same direction on the condition that the leakage current flows through at least one element of the passive bridge circuit.

7. The leakage current detection system of claim 1, wherein the leakage surge structure is configured to draw at least a portion of the leakage current from the first branch and draw at least another portion of the leakage current from the second branch.

8. The leakage current detection system of claim 1, wherein the processing device is configured to perform the common mode test by calculating a common mode voltage of the first and the second outputs based on the summed value, compare the calculated common mode voltage to common mode value that is equal to a predefined fraction of a supply voltage of the passive bridge circuit, and, on a condition the common mode voltage differs from the common mode value by at least a predetermined threshold, transmitting the monitored result that indicates an error.

9. The leakage current detection system of claim 1, wherein the leakage surge structure has a shape with an axis that extends at least partially between the first and the second outputs.

10. The leakage current detection system of claim 1, wherein the leakage surge structure is a bond pad bonded to the common node.

11. The leakage current detection system of claim 1, wherein the leakage surge structure is formed by a chain of connected bond pads connected to the common node.

12. The leakage current detection system of claim 1, further comprising:
a conductive ring that encircles the passive bridge circuit, and
wherein the leakage surge structure extends from the conductive ring.

13. The leakage current detection system of claim 1, wherein the leakage surge structure forms a one-piece integral metal structure with a bond pad of the common node.

14. The leakage current detection system of claim 1, wherein the first branch includes a first upper branch element and a first lower branch element connected in series and the second branch includes a second upper branch element and a second lower branch element connected in series, the first upper branch element and the second upper branch element being connected to a first supply potential, the first lower branch element and the second lower branch element being connected to a second supply potential, and the leakage surge structure is configured to provide a conductive path for the leakage current to flow through the first upper branch element to the first output and through the second upper branch element to the second output and to circumvent the first lower branch element and the second lower branch element.

15. A method of detecting a leakage current in a passive bridge circuit comprising a first branch having a first output and a second branch having a second output, the method comprising:
sinking a leakage current to a leakage surge structure, wherein the leakage surge structure is electrically connected to a common node at which the first branch and the second branch are connected and is configured to draw a leakage current thereto from the passive bridge circuit;
monitoring for an abnormal measurement caused by the leakage current, including summing a first output value at the first output with a second output value at the second output to determine a summed value, and performing a common mode test using the summed value for detecting the abnormal measurement; and
outputting a monitored result indicating the leakage current based on detecting the abnormal measurement.

16. The method of claim 15, further comprising:
pulling voltages at the first and the second outputs in a same direction on a condition that the leakage current flows through at least one element of the passive bridge circuit to the leakage surge structure, wherein, in an absence of the leakage current, the voltages at the first and the second outputs change in opposite directions.

17. The method of claim 15, wherein performing a common mode test comprises:
determining that half of the summed value is equal to a common mode potential of the passive bridge circuit as an indication that the leakage current is not present, and determining that half of the summed value is not equal to the common mode potential of the passive bridge circuit as an indication that the leakage current is present.

18. The method of claim 15, further comprising:
calculating a common mode voltage of the first and the second outputs based on the summed value;
comparing the calculated common mode voltage to common mode value that is equal to a predetermined fraction of a supply voltage of the passive bridge circuit; and
on a condition the common mode voltage differs from the common mode value by at least a predetermined threshold, transmitting the monitored result that indicates the abnormal measurement.

19. A leakage current detection system, comprising:

a passive bridge circuit disposed on a circuit substrate, the passive bridge circuit comprising a first branch having a first output and a second branch having a second output;

a leakage surge structure disposed on the circuit substrate, wherein the leakage surge structure is electrically connected to a common node at which the first branch and the second branch are connected and is configured to draw a leakage current thereto from the passive bridge circuit;

a resistive element connected to the leakage surge structure to draw the leakage current thereto from the leakage surge structure; and a processing device configured to monitor for the leakage current;

wherein the processing device is coupled to the resistive element and further configured to measure a voltage drop across the resistive element, perform a comparison evaluation by comparing the measured voltage drop to an expected voltage drop, and transmit a monitored result based on the comparison evaluation.

20. The leakage current detection system of claim 19, the leakage surge structure is configured to draw the leakage current from the passive bridge circuit and pull voltages at the first and the second outputs in a same direction on a condition that the leakage current flows through at least one element of the passive bridge circuit, and, in an absence of the leakage current, the passive bridge circuit is configured such that the voltages at the first and the second outputs change in opposite directions.

21. The leakage current detection system of claim 19, wherein the leakage surge structure is directly connected to the common node.

22. The leakage current detection system of claim 19, wherein the passive bridge circuit and the leakage surge structure are mutually exclusive from each other.

23. The leakage current detection system of claim 8, wherein the processing device is configured to, on a condition the common mode voltage differs from the common mode value by less than the predetermined threshold, determine that the leakage current is not present.

* * * * *